United States Patent
Yeung et al.

(10) Patent No.: US 8,539,272 B1
(45) Date of Patent: Sep. 17, 2013

(54) REDUCING LEAKAGE CURRENT DURING LOW POWER MODE

(75) Inventors: Rudolph Yeung, Sunnyvale, CA (US); Patrick Chan, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 355 days.

(21) Appl. No.: 12/832,867

(22) Filed: Jul. 8, 2010

(51) Int. Cl.
*G06F 1/00* (2006.01)
*G06F 17/50* (2006.01)
*G06F 9/455* (2006.01)

(52) U.S. Cl.
USPC ............ 713/324; 716/100; 716/101; 716/104

(58) Field of Classification Search
USPC .................................. 713/300–340; 716/100
See application file for complete search history.

(56) References Cited

U.S. PATENT DOCUMENTS

| 5,608,781 | A | * | 3/1997 | Seiderman ................... 455/410 |
| 5,812,463 | A | * | 9/1998 | Park ......................... 365/189.05 |
| 6,653,868 | B2 | * | 11/2003 | Oodaira et al. ............... 326/121 |
| 6,934,923 | B2 | * | 8/2005 | Oodaira et al. ............... 716/104 |
| 2009/0210728 | A1 | * | 8/2009 | Saint-Laurent et al. ...... 713/320 |
| 2011/0041115 | A1 | * | 2/2011 | Potkonjak ..................... 716/136 |
| 2011/0140278 | A1 | * | 6/2011 | Chen et al. .................... 257/773 |
| 2011/0181331 | A1 | * | 7/2011 | Srivastava et al. ........... 327/215 |

OTHER PUBLICATIONS

Narendra et al., Leakage in nanometer CMOS technologies, 2006, Springer, CH 2, CH 5, CH 13, CH 10.*
Piguet, Low Power CMOS circuits: technology, logic design, and CAD tools, 2005, CRC Press, Ch 11.*
Chen et al., Iddq testing for deep-submicron ICs: challenges and solutions, 2002, IEEE Design and test of computers.*

* cited by examiner

*Primary Examiner* — Kim Huynh
*Assistant Examiner* — Austin Hicks
(74) *Attorney, Agent, or Firm* — DeLizio Gilliam, PLLC (57) ABSTRACT

An apparatus is disclosed that may include an integrated circuit (IC) with an initialization bus configured to communicate with at least one low power mode latch operating during a initialization mode to set a value into the low power mode latch and configured to respond to the assertion of a low power mode signal by selecting the low power mode latch state to drive at least one logic gate to minimize leakage current during the low power mode. The IC may similarly configure and operate a RAM. A leakage control table may be used during initialization mode and created by other embodiments. The net list of a circuit block including at least part of the configuration block and lower power control latch may be used and/or modified to create a new net list to further minimize leakage current during low power mode. Installation packages and program systems are disclosed.

21 Claims, 9 Drawing Sheets

REDUCING LEAKAGE CURRENT DURING LOW POWER MODE

TECHNICAL FIELD

This invention relates to integrated circuit apparatus, operations and/or design regarding at least one low power mode.

BACKGROUND OF THE INVENTION

Many devices, particularly handheld devices, are required to operate for long periods of time on battery power. To do this, such devices often support one or more lower power modes of operation, such as while waiting to receive a message or phone call. During such times, various parts of these devices may be put into a low power mode that reduces their power consumption.

Many of these devices are built using one or more integrated circuits that are often made of Complementary Metal-Oxide Semiconductor (CMOS) transistors. The transistors tend to be used in two distinct kinds of circuits, often known as digital and analog circuits. This patent application will focus on digital circuits that tend to operate on signals coded as 0's and 1's, which are often referred to as bits.

Logic circuits are frequently composed of logic cells that may store bits and/or operate on bits. The logic cells are often part of a library of cells that have been designed, not only electrically, but also as layout templates, simulated, verified and tested for the specific semiconductor manufacturing process for the intended integrated circuit.

Examples of logic cells often found in cell libraries include, but are not limited to, logic gates and latches. Examples of logic gates include nand and nor gates. A nand gate forms the logic complement of the conjunction of two or more inputs, so that a two input nand gate may receive two logical inputs and generate an output which is '1' when either input is '0', and generate an output of '0' when both inputs are '1'. A nor gate with two inputs generates an output of '1' when both inputs are '0' and an output of '0' when at least one input is '1'.

Logic latches tend to maintain an internal state that forms their output. Examples of latches include D flip-flops and R-S latches. The D flip-flop receives a clock signal and a data signal, and the internal state changes by capturing the data signal at a transition of the clock signal. An R-S (Reset-Set) latch receives a reset signal and a set signal, and operates under the condition that both the reset and set signal are not both asserted (set to '1') at the same time. When the reset signal is asserted, the internal state is set to '0'. When the set signal is asserted, the internal state is set to 1. Some logic latches may have outputs that are further conditioned or gated.

Reducing leakage current in low power mode operations of integrated circuits extends the battery life of the devices using these integrated circuits. In the prior art, the leakage current may be reduced using specialized latches that receive a specialized power control signal, placing them in the low power mode, and enabling output of a lower power setting that reduces the leakage current during low power mode in the integrated circuit logic cells.

CMOS transistors typically include three electrical terminals, known as the source, gate and drain. The threshold voltage of a CMOS transistor may be considered to be the voltage at the gate that causes a low resistance path to form between the source and the drain. To reduce power consumption during their active modes, CMOS transistors may be built with reduced load capacitance and threshold voltages. However, this can increase leakage power dissipation due to an increase in sub-threshold leakage currents, particularly in low power mode.

These problems generally arise after the design and manufacturing and before even one of the integrated circuit and the devices using these integrated circuits make any revenue for their manufacturer. There are other problems with this approach that affect the time from the start of design until revenue generation begins, which is known as the time to market. The prior art approach has several other problems in this context including but not limited to the following.

First, use of a specialized latch and/or flip-flop requires adding these cells to the cell library available to design the integrated circuit. This adds to the circuit design, simulation and verification overhead for the cell library, and requires characterization of these cells in the manufacturing process for the integrated circuit. Each and all of these steps cost money and increase the time to market for the integrated circuit and the device that uses it.

Second, these specialized latches and/or flip-flops may be larger than the corresponding cells of the existing cell libraries.

Third, these specialized cells tend to have added drive capacitance during normal operations, consuming more power and possibly reducing performance.

Fourth, the low leakage state is built into these special cells, often leading to no way to fix a bug without a new round of silicon, which is extremely expensive.

And fifth, these specialized circuits are often challenging to fully test due to their added complexity.

These problems translate into added costs throughout the design, prototype and production phases of such integrated circuits while often increasing the critical path for the time to market for the devices using these integrated circuits.

Mechanisms and methods are needed that address at least some of these problems.

SUMMARY OF THE INVENTION

An integrated circuit is disclosed that may include a processor configured to use at least one standard cell latch during a low power mode. Such standard cell latches are referred to herein as low power mode latches. The processor communicates via an initialization bus with the low power mode latch to set a value into the low power mode latch. The integrated circuit responds to an assertion of a low power mode signal by selecting the low power mode latch state to drive at least one logic gate to minimize leakage current during the low power mode. This basic approach supports rapid entry and exiting of the low power mode, in that initialization is performed once and the integrated circuit may rapidly enter and exit low power mode many times afterward.

The integrated circuit may further include at least one Random Access Memory (RAM) generating a ram output and a low power mode latch configured by the initialization bus. The output of the low power mode latch is selected by a selector as directed by the low power mode signal to drive additional logic gates to minimize leakage during the low power mode. The ram output is not altered by this approach to minimizing leakage and permits a rapid return to normal mode. The low power mode latch may also be included in a Finite State Machine (FSM).

The integrated circuit may also include at least one RAM configured by the initialization bus to include the low power state. The ram address may respond to the oncoming low power mode as part of fetching the low power state to drive through the normal ram output an additional logic gate to minimize leakage current during the low power mode.

The integrated circuits may be configured to operate on battery power. The integrated circuit may include a circuit block including at least part of the initialization bus and the low power mode latch. The integrated circuit may further include analog circuitry. The integrated circuit may include a transmitter and/or a receiver, which in some embodiments may implement a Wireless LAN (WLAN) service, either as a client or as an access point. The integrated circuit may be included in a multi-chip module.

Another embodiment includes a method for determining the low power mode value for at least one low power mode latch communicatively coupled to the initialization bus, all within a circuit block determined by a net list.

Determining the low power mode value may use a list of primary circuit outputs and the net list of the circuit block to derive a net list path to at least one of the low power mode latches and determines the low power mode value for that low power mode latch that minimizes the leakage current during low power mode. This method insures that the leakage current is minimized through the net list path during the low power mode.

The method produces the low power mode value for at least one low power mode latch. The method may further include assembling the low power mode values for multiple low power mode latches into a leakage control table possibly including how to use the initialization bus to communicate with the low power mode latches.

The leakage control table may be included in a computer readable memory, a non-volatile memory and/or a disk drive.

The circuit block may be represented as a net list that may be used to determine a low power mode value for at least one low power mode latch and/or to create a new net list that may represent a version of the circuit block that may better support low power mode by reducing a leakage current estimate based upon using a new configuration map. The method may produce the new net list from the net list.

DETAILED DESCRIPTION

This invention relates to integrated circuit apparatus and operations regarding a low power mode. The integrated circuit may include a processor configured to communicate via an initialization bus with at least one low power mode latch during an initialization mode to set a value into the low power mode latch. The integrated circuit may be configured to respond to the assertion of a low power mode signal through selecting the low power mode latch state to drive at least one logic gate to minimize leakage current during the low power mode.

Figure 1:
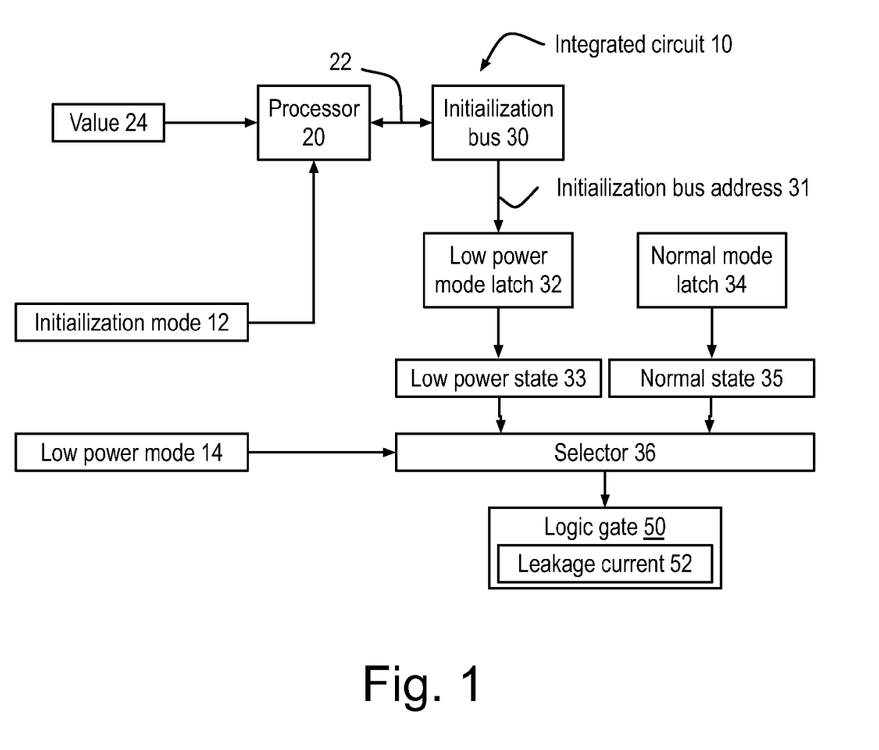
FIG. 1 shows an example of the integrated circuit that may include a processor configured to communicate via an initialization bus with at least one low power mode latch during an initialization mode to set a value into the low power mode latch with the integrated circuit configured to respond to the assertion of a low power mode signal by selecting a low power mode latch state to drive at least one logic gate to minimize leakage current during the low power mode.

Referring to the drawings more particularly by reference numbers, FIG. 1 shows an example of the integrated circuit 10 that may include a processor 20 configured to communicate 22 via an initialization bus 30 with at least one low power mode latch 32. The operations of this embodiment may be directed by the processor 20 that may operate the initialization bus 30 during an initialization mode 12 to set a value 24 into the low power mode latch 32. The integrated circuit 10 may be configured to respond to the assertion of a low power mode signal 14 through a selector 36 selecting the low power mode latch state 33 to drive at least one logic gate 50 to minimize leakage current 52 during a low power mode. When the integrated circuit 10 is in normal operating mode, the low power mode signal 14 is not asserted and the normal state 35 of the normal mode latch 34 is selected 36 to drive the logic gate 50 without regard to minimizing the leakage current 52.

Figure 2A:
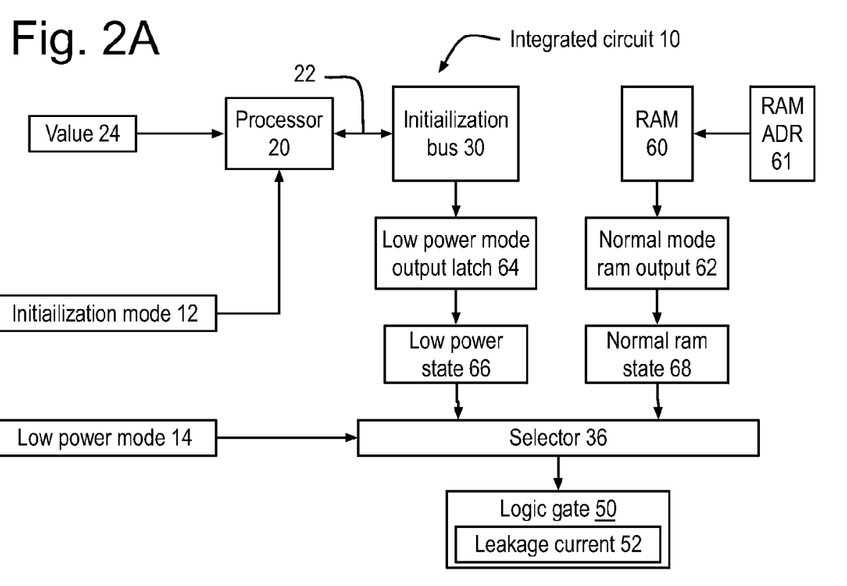
FIGS. 2A and 2B show the integrated circuit of FIG. 1 may further include at least one Random Access Memory (RAM) in various configurations supporting reduced leakage current in low power mode.

FIG. 2A shows the integrated circuit 10 of FIG. 1 may further include at least one Random Access Memory (RAM) 60 generating a ram output 62 and a low power mode latch 64 configured by the initialization bus 30 whose output is referred to herein as a low power state 66 is selected by a selector 36 as directed by the low power mode signal 14 to drive at least one additional logic gate 50 to minimize leakage current 52 during the low power mode. The ram output 62 may not be altered by this approach to minimizing leakage and permits a rapid return to normal mode.

Figure 2B:
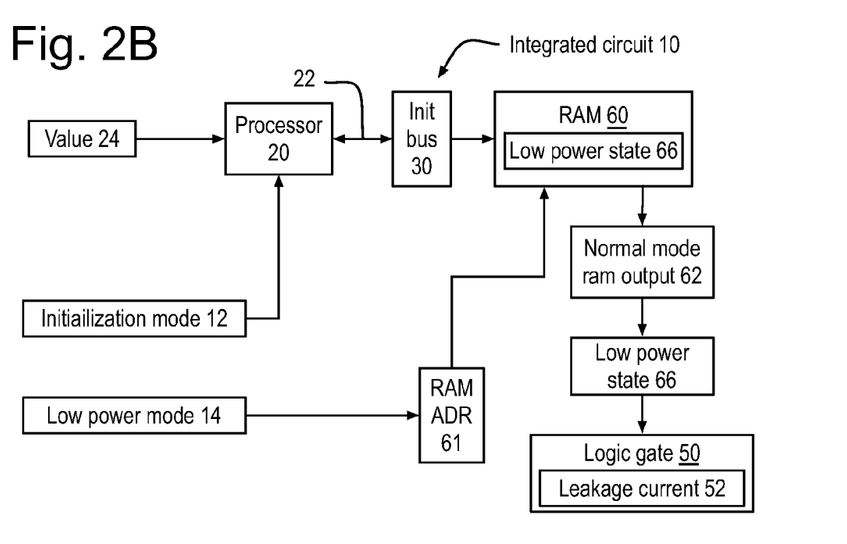

FIG. 2B shows the integrated circuit 10 of FIG. 1 may also include at least one Random Access Memory (RAM) 60 generating a ram output 62 and configured by the initialization bus 30 to include the low power state 66. The ram address 61 may respond to the oncoming low power mode 14 as part of fetching the low power state 66 to drive through the normal ram output 62 an additional logic gate 50 to minimize leakage current 52 during the low power mode.

Figure 3:
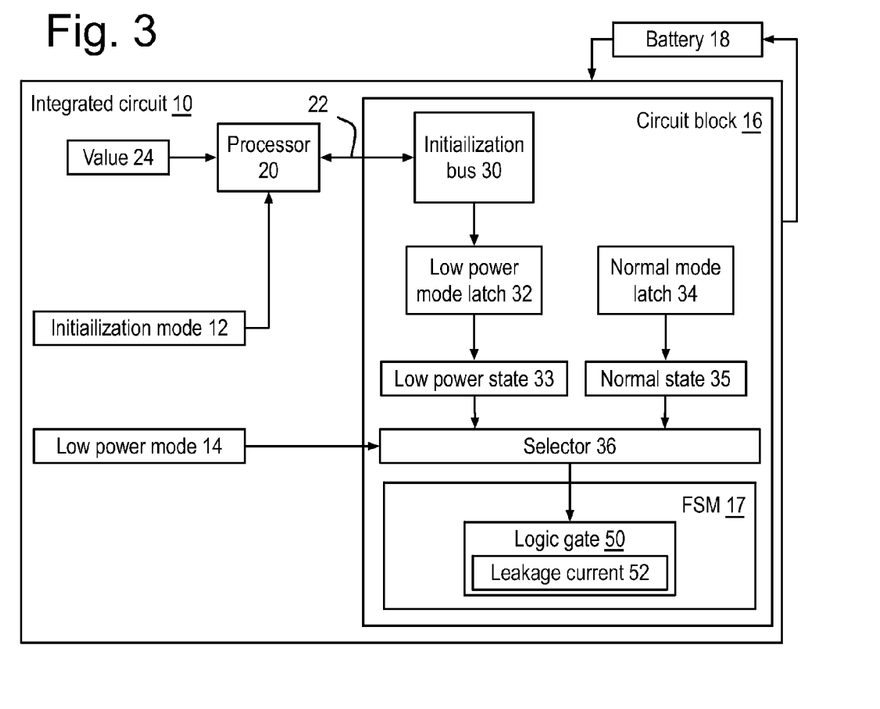
FIG. 3 shows the integrated circuit may be configured to operate on battery power from at least one battery and/or may include a circuit block including at least part of the initialization bus and the low power mode latch may be included in a Finite State Machine (FSM).

FIG. 3 shows the integrated circuit 10 may be configured to operate on battery power from at least one battery 18 and/or the integrated circuit 10 may include a circuit block 16 including at least part of the initialization bus 30 and the low power mode latch 32, that may be included in a Finite State Machine (FSM) 17.

Figure 4:
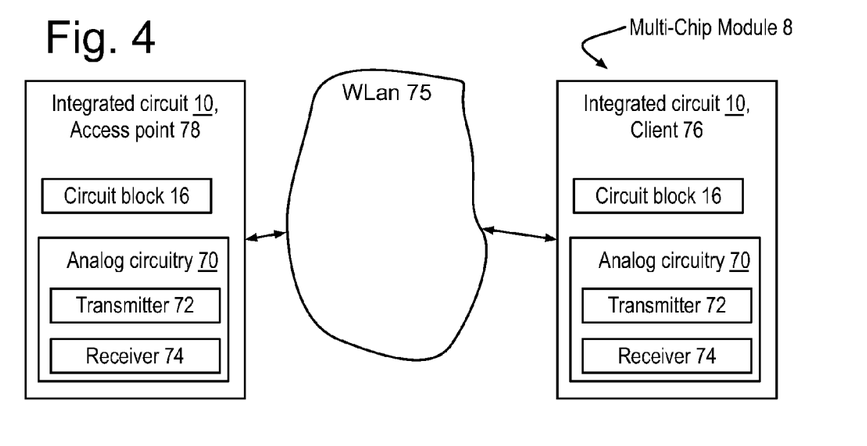
FIG. 4 shows two instances of the integrated circuit that may further include analog circuitry that may include a transmitter and/or a receiver, which in some embodiments may implement a Wireless LAN (WLAN) service, either as a client or as an access point.

FIG. 4 shows two instances of the integrated circuit 10 that may further include analog circuitry 70 that may include a transmitter 72 and/or a receiver 74, which in some embodiments may implement a Wireless LAN (WLAN) service 75, either as a client 76 or as an access point 78. The integrate circuit 10 may be included in a multi-chip module 8.

Figure 5:
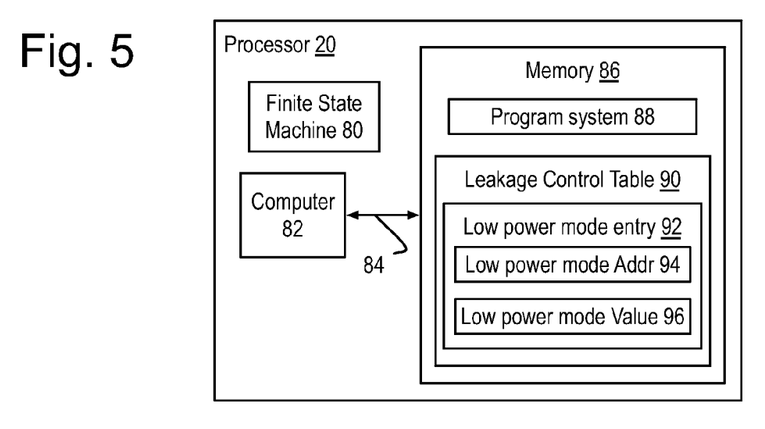
FIG. 5 shows the processor may include at least one instance of a finite state machine and/or a computer instructed by a program system residing in a computer readable memory accessibly coupled to the computer.

FIG. 5 shows the processor 20 may include at least one instance of a finite state machine 80 and/or a computer 82 instructed by a program system 88 residing in a computer readable memory 86 accessibly coupled 84 to the computer 82. The memory 86 may include a non-volatile memory. The processor 20 may include and/or access a leakage control table 90 of at least one low power mode entry 92 including an initialization bus address 31 as a low power mode address 94 and at least one low power mode value 96 used to set the value 24 into the low power mode latch 32 and/or into the low power ran output latch 64 as shown in FIGS. 1 to 3.

Figure 7:
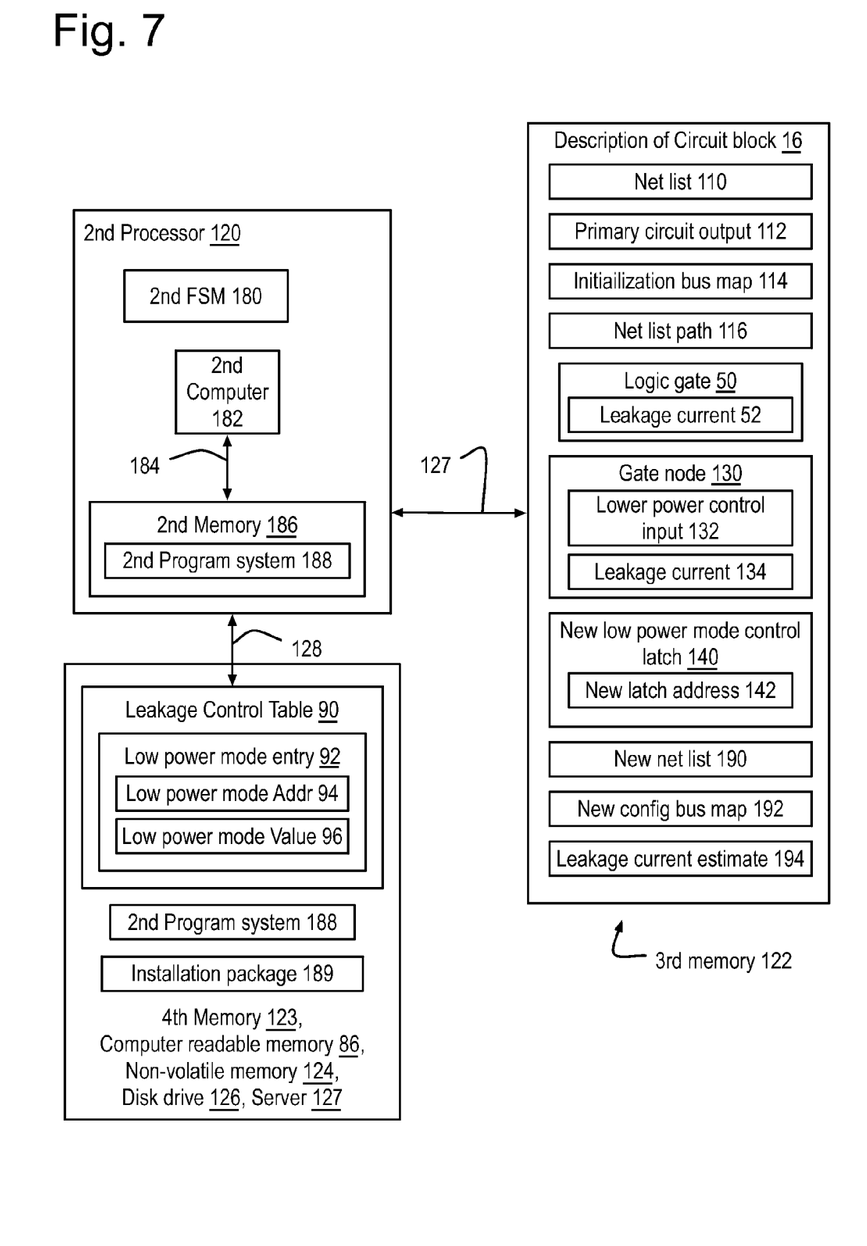
FIG. 7 shows an example of a system including at least one second processor communicating with a description of the circuit block to create the leakage control table discussed regarding FIGS. 5 and 6.

As used herein, any computer 82 as shown in FIG. 5 or 182 as shown in FIG. 7 may include at least one data processor and at least one instruction processor instructed by a program system 88 or 188, where each of the data processors is instructed by at least one of the instruction processors. These computers 82 and 182 are shown with separate reference numbers in that they perform fundamentally different functions in distinct system settings. These distinctions may be understood in part from the discussion of their corresponding program systems 88 and 188. The program system 88 instructs the processor 20 in response to the initialization mode signal 12 being asserted to use the initialization bus 30 to set a value 24 in the low power mode latch 32. The second program system 188 generates the leakage control table 90 of FIG. 5 and/or generates a new net list 190, in both cases based upon the net list 110 of a description of the circuit block 16 as shown in FIG. 7.

As used herein, a finite state machine 17 as in FIG. 3, 80 as in FIG. 5 or 180 as in FIG. 7 receives at least one input, maintains and updates at least one state and generates at least one output based upon the value of at least one of the inputs and/or the value of at least one of the states. These finite state machines 17, 80 and 180 are shown with separate reference numbers in that they perform fundamentally different functions in several systems settings. Typically, the finite state machines 17 can be associated with normal mode(s) of operation. The finite state machine 80 may operate similarly for at least part of the program system 88. And the finite state machine 180 may operate similarly for at least part of the program system 188.

Figure 6:
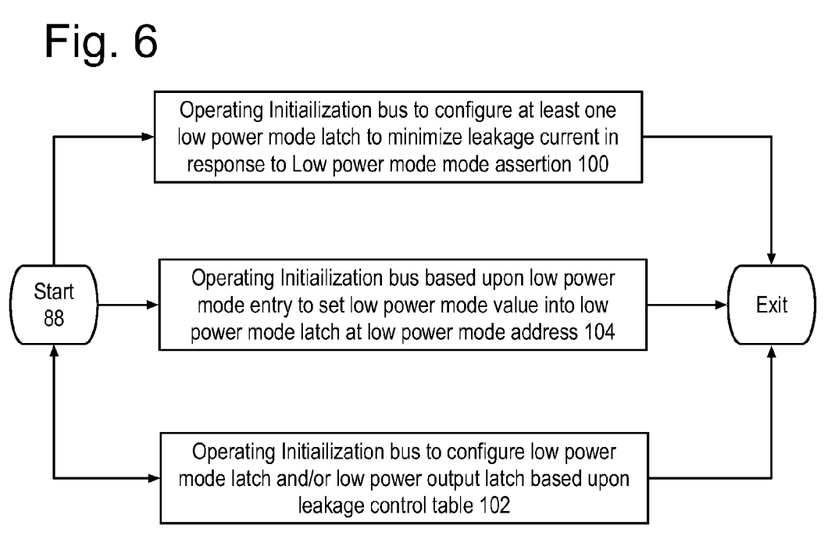
FIG. 6 shows flowchart of some details of the operation of the processor in response to the assertion of the initialization mode signal of FIGS. 1-3 in terms of flow charts of the program system.

FIG. 6 shows a flowchart of some details of the program system 88 instructing the processor 20 in response to the assertion of the initialization mode signal 12 of FIGS. 1-3. FIGS. 10 through 13 show additional flowcharts that will be discussed shortly. These flowcharts show some method embodiments, which may include arrows signifying a flow of control, and/or data, supporting various implementations. These may include a program operation, or program thread, executing upon the computer 82 or 182 and/or states of a finite state machine 80 or 180. Each of these program steps may at least partly support the operation to be performed. The operation of starting a flowchart refers to entering a subroutine or a macroinstruction sequence in the computer or of a possibly initial state or condition of the finite state machine. The operation of termination in a flowchart refers to completion of those operations, which may result in a subroutine return in the computer or possibly return the finite state machine to a previous condition or state. A rounded box with the word "Exit" in it denotes the operation of terminating a flowchart.

FIG. 6 shows a flowchart of the program system 88 including any combination of the following: Program step 100 that supports operating the initialization bus 30 to configure at least one low power mode latch 32 to minimize leakage current 52 in at least one logic gate 50 in response to asserting the low power mode signal 14. Program step 102 that support operating the initialization bus 30 to configure at least one low power mode latch 32 and/or the low power mode output latch 64 based upon the leakage control table 90. Program step 104 operating the initialization bus 30 based upon the low power mode entry 92 to set the low power mode value 96 into the low power mode latch 32 at the low power mode address 96.

The circuit block 16 (as shown in FIG. 4) may be represented as a net list 110, as shown in FIG. 7. The net list 110 may be used to determine a low power mode value 96 for at least one low power mode latch 32 communicatively coupled to the initialization bus 30. The net list 110 may also be used create a new net list 190 that may represent a version of the circuit block 16 that may better support low power mode 14 by reducing the leakage current estimate 194 based upon using a new configuration map 192. Such uses may constitute another embodiment that includes a method for determining the low power mode value 96 for at least one low power mode latch 32 communicatively coupled to the initialization bus 30, all within a circuit block 16 determined by a net list 110. This method will be illustrated through an example shown as a system block diagram in FIG. 7 and may be embodied as the second program system 188 possibly residing in a second computer readable memory 186. The second computer readable memory 186 may include a non-volatile memory 124 and/or a disk drive 126 with its file management system.

FIG. 7 shows an example of a system performing several inventive operations that may be part of the design of the integrated circuit 10 and/or the circuit block 16. Some operations create a leakage control table 90 that includes a low power mode entry 92 configured to use a low power mode value 96 for a low power mode latch 32 communicatively coupled to the initialization bus 30 within the integrated circuit 10 as was shown in the preceding Figures. Creating the leakage control table 90 makes use of a net list 110 and an initialization bus map 114, both of the integrated circuit 10 and/or the circuit block 16, to create a low power mode entry 92 configured to use a low power mode value 96 for a low power mode latch 32 communicatively coupled to the initialization bus 30 within the integrated circuit 10 as was shown in the preceding Figures.

Other operations create a new net list 190 from the net list 110 of the integrated circuit 10 and/or the circuit block 16. Creating the new net list 190 may also include creating a new configuration bus map 192, possibly through the including of a new low power mode control latch 140 to support a lower leakage current estimate 194.

FIG. 7 shows the example system including at least one second processor 120 communicating 127 with a third memory 122 that may include a description of the circuit block 16 and also communicating 128 with a fourth memory 123 that may include the leakage control table 90 discussed regarding FIGS. 5 to 8. The second processor 120 may be configured to determine the leakage control table 90 based upon the description of the circuit block 16. The third memory 122 and the fourth memory 123 may be integrated as a single functional unit, such as a computer readable memory 86, a non-volatile memory 124 and/or a disk drive 126. The second processor 120 may include at least one instance of a second Finite State Machine 180 and/or a second computer 182 that may be instructed by a second program system 186 residing in a second memory 186 second accessibly coupled 184 to the second computer 182.

The description of the circuit block 16 may include, but is not limited to, a net list 110, a list of at least one primary circuit output 112 and the initialization bus map 114 of the initialization bus 30 in the circuit block 16. The second processor 120 determines the low power mode value 96 using the list of primary circuit outputs 112 and the net list 110 of the circuit block 16 to derive a net list path 116 to at least one of the low power mode latches 32 referenced by its initialization bus address 31 as the low power mode address 94 and determines the low power mode value 96 for that low power mode latch 32 that minimizes the leakage current 52 of the at least one logic gate 50 during low power mode 14. This method insures that the leakage current 52 is minimized through the net list path 116 during the low power mode 14.

FIG. 7 also shows the fourth memory 123, and/or the computer readable memory 86, and/or the non-volatile memory 124, and/or the disk drive 126, and/or a server 127 may include an installation package 189 that may be configured to instruct the computer 82 to create the program system 88 in the first processor 20 of FIG. 5. The installation package 189 may be configured to instruct the second computer 182 to create the second program system 188. The installation package 189 may include relocatable or non-relocatable images of the memory 86 and/or of the second memory 186. The installation package 189 may be configured to instruct the computer 82 and/or 182 to compile and/or generate part or all of the program system 86 and/or the program system 186 in accord with this disclosure.

In other embodiments, the fourth memory 123, and/or the computer readable memory 86, and/or the non-volatile memory 124, and/or the disk drive 126, and/or the server 127 may include the second program system 188 and/or the program system 88, which is not shown in FIG. 7.

Figure 8:
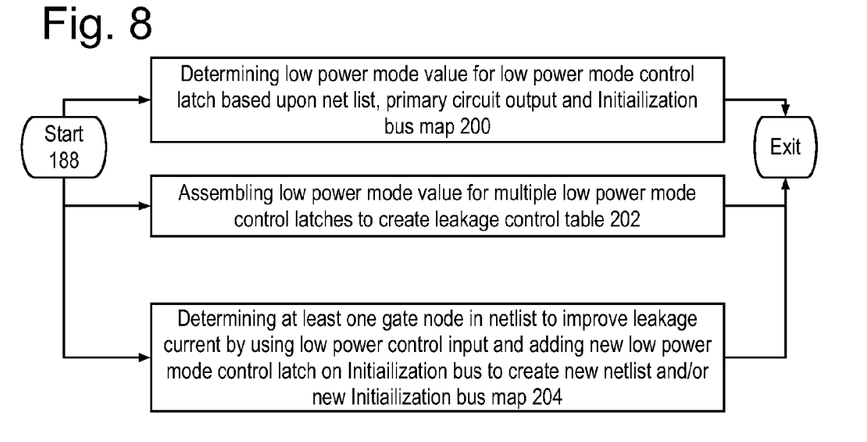
FIG. 8 shows a flowchart of some details of a second program system of FIG. 7 that creates the leakage control table based upon the description of the circuit block and/or may also create a new net list from the net list.

FIG. 8 shows some details of the second program system 188 that creates the leakage control table 90 based upon the description of the circuit block 16 as shown in FIG. 7 as shown through two program steps 200 and 202 and may also include creating a new net list as shown through program step 204.

Program step 200 supports determining the low power mode value include based upon a list of at least one primary circuit output 112 and the net list 110 from the circuit block 16 to derive the net list path 116 to the low power mode latch 32 and determines the low power mode value 94 for that low power mode latch 32 and/or 64 that minimizes the leakage current 50 of at least one logic gate 50 during low power mode 14. This program step insures that the leakage current 52 is minimized through the net list path 116 during the low power mode 14.

Program step 202 supports assembling the low power mode values 96 for multiple low power mode latches 32 and/or 64 into a leakage control table 90 possibly including how to use the initialization bus 30 to communicate with the low power mode latches 32 and/or 64. The initialization bus 30 usage may be summarized as include a low power mode address 94 and possibly a low power address range or length, which is not shown.

The leakage control table 90 may be included in a computer readable memory 86, a non-volatile memory 124 and/or a disk drive 126.

The system of FIG. 7 or a similar system may further determine at least one gate node 130 in the net list 110 that would improve its leakage current 134 by using a low power control input 132 in the gate node 130 and adding a new low power mode latch 140 communicatively coupled to the initialization bus 30 to drive the low power control input 132 during the low power mode 14, possibly at a new latch address 142, to improve control of the leakage current 134. This acts to create a new net list 190 further including the low power control input 132 driven by the new low power mode latch 140 and its communicative coupling to the initialization bus 30 as further represented by the new initialization bus map 192. The operation of the second program system 188 may produce a leakage current estimate 194 in the low power mode 14 for at least one of the following: the integrated circuit 10, the circuit block 16 and/or the multi-chip module 8.

FIG. 8 also shows program step 204 to create the new net list 190 from the net list 110. Program step 204 supports determining at least one gate node 130 in the net list 110 that would improve its leakage current 134 by using a low power control input 132 in the gate node 130 and adding a new low power mode latch 140 communicatively coupled to the initialization bus 30 to improve control of the leakage current 134 by creating the new net list further including the low power control input driven by the new low power mode latch 140 during low power mode 14 and its communicatively coupling to the initialization bus 30.

Figure 9:
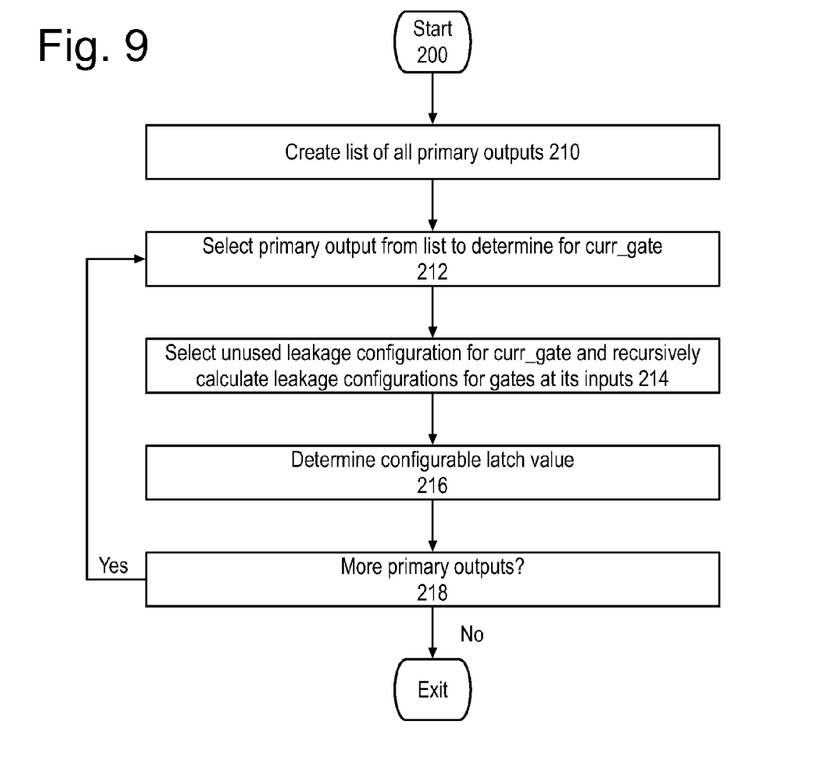
FIGS. 9 and 10 show flowcharts of an example method of determining the low power mode values as details of FIG. 8.
Figure 10:
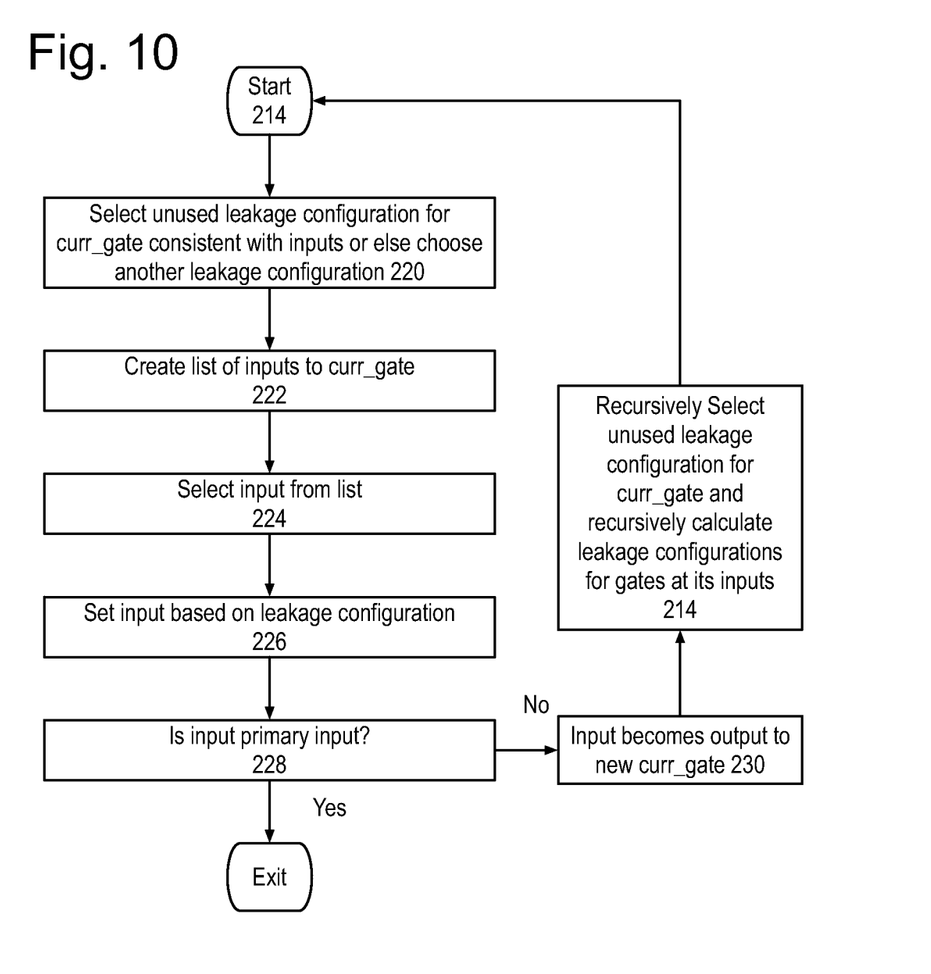

FIGS. 9 and 10 show flowcharts of an example method of determining the low power mode values as details of program step 200 of FIG. 8. FIG. 9 shows determining the low power mode values through the following program steps: Program step 210 supports creating a list of all primary circuit outputs 112. Program step 212 supports selecting a primary circuit output from the list to determine the curr_gate. Note that the curr_gate may represent and/or point to a representation of the gate mode 130 and/or the logic gate 50 in various embodiments. Program step 214 supports selecting an unused leakage configuration for the curr_gate and recursively calculating leakage configurations for gates at its inputs. Program step 216 supports determining the configurable latch value. The configurable latch value may represent the low power state 33 configured for low power mode latch 32 as in FIGS. 1 and/or 3, the low power state 66 of the low power mode output latch 64 as in FIG. 2A and/or represent the low power state 66 configured to reside in RAM 60 as in FIG. 2B. Program step 218 supports determining if there are more primary circuit outputs 112 in the list. If yes, program steps 212, 214, 216 and 218 are successively executed. If there are no more primary circuit outputs 112, then exit.

FIG. 10 shows some details of an example embodiment of program step 214, selecting the unused leakage configuration for the curr_gate and recursively calculating leakage configurations for gates at its inputs. Program step 220 supports selecting an unused leakage configuration for the curr_gate consistent with the inputs or else choosing another leakage configuration. Program step 222 supports creating a list of inputs to the curr_gate. Program step 224 supports selecting an input from the list of inputs. Program step 226 supports setting the input based upon the leakage configuration. Program step 228 supports determining if the input is a primary input. If input is a primary output, then exit. If the input is not a primary input, then program step 230 is executed. Program step 230 supports the input becoming an output of a new curr_gate. This leads to recursively executing program step 214, selecting the unused leakage configuration for the curr_gate and recursively calculating leakage configurations for gates at its inputs.

Figure 11A:
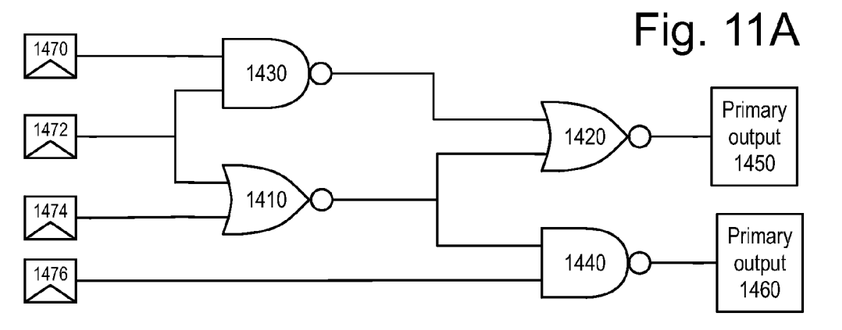
FIGS. 11A to 11E show an example gate network walk through of the method determining the low power mode values based upon the flowcharts of FIGS. 10, 12 and 13.

FIGS. 11A to 11E show an example circuit which may be used to illustrate the program steps of FIGS. 9 and 10. FIG. 11A shows a circuit comprising two NOR gates 1410 and 1420, two NAND gates 1430 and 1440, four configuration latches 1470, 1472, 1474 and 1476 and two primary circuit outputs 1450 and 1460 coupled as shown. In one embodiment, the configuration latches 1470-1476 may be low power mode latches as described herein.

TABLE 1

| A | B | Output | Leakage current |
|---|---|---|---|
| | | Nand2 | |
| 0 | 0 | 1 | 7.3 pico amps |
| 0 | 1 | 1 | 8.4 pico amps |
| 1 | 0 | 1 | 7.8 pico amps |
| 1 | 1 | 0 | 14 pico amps |
| | | Nor2 | |
| 0 | 0 | 1 | 15.8 pico amps |
| 0 | 1 | 0 | 17.7 pico amps |
| 1 | 0 | 0 | 18.1 pico amps |
| 1 | 1 | 0 | 10.3 pico amps |

Table 1 shows a leakage power table that may be associated with the NAND and NOR circuit elements of FIGS. 11A to 11E. For every possible input state, an amount of leakage current is listed. For the purposes of this example, the current may be in pico amps. In other embodiments, a similar table may be put together that lists leakage current for every circuit element that may be included in any arbitrary circuit under consideration.

Figure 11B:
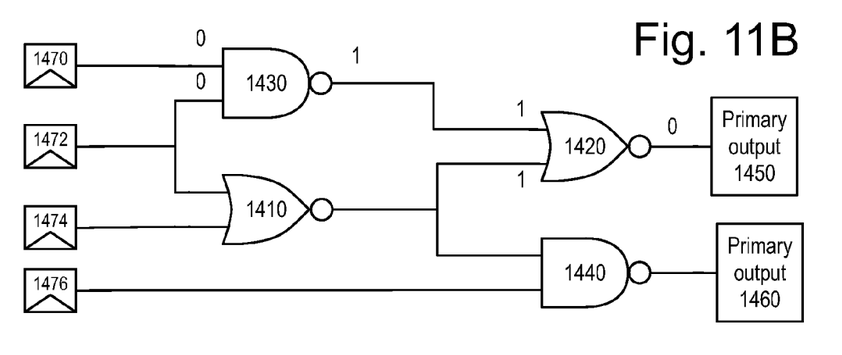

One implementation of the method outlined in FIGS. 9 and 10 starts as shown in FIG. 11B. It may start by creating (step 210) the list of primary outputs 1450 and 1460. The primary circuit output 1450 may be selected (step 212) from the list of primary outputs and the curr_gate may be determined to be the nor gate 1420. As shown in Table 1, the lowest leakage current mode for the NOR gate 1420 is when the output of the NOR gate 1420 is '0' and the inputs are both '1' as a result of selecting (step 214) this unused leakage configuration.

In selecting (step 214) the unused leakage configuration, the following occurs: the list of inputs to the gate 1420 is created (step 222). The upper input of NOR 1420 is selected (step 224) from the list of inputs. The upper input of NOR 1420 is coupled to the output of NAND 1430 and this input becomes (step 230) the output of the new curr_gate, which is NAND 1430, with the selecting (step 214) being now recursively called.

In this new call to selecting (step 214), the output of the curr_gate, the NAND 1430 must also be a '1'. Its list of inputs is created (step 222). In order for the output of NAND 1430, the inputs for this NAND gate must both be selected (step 226) to '0' based upon the leakage configuration. This implies that the configuration latches 1470 and 1472 should be configured to drive an output '0'.

Figure 11C:
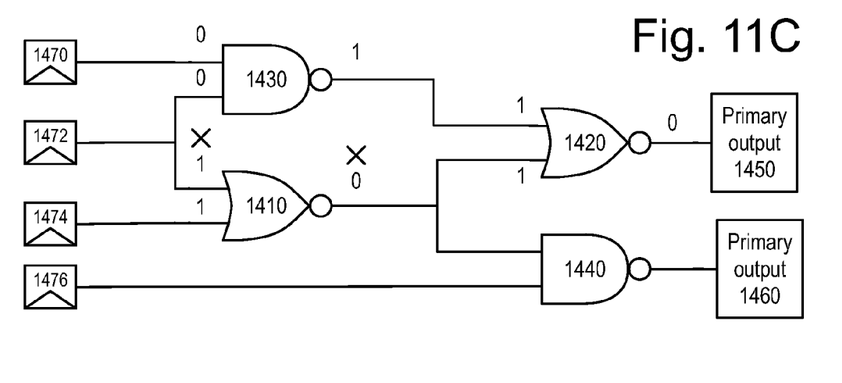

A second stage is shown in FIG. 11C. The lowest leakage state of NOR 1410 would be with its related inputs at '1' and its related output at '0'. There is a conflict, however, shown by X's. The output of NOR 1410 cannot be a '0' since it is coupled to the input of NOR 1420 and the method has already determined that the input of NOR 1420 should be a '1'. Similarly, one of the inputs of NOR 1410 is coupled to configuration latch 1472 and NAND 1430. This node is set to '0'. These determinations are part of the program step (step 220) of FIG. 10.

Figure 11D:
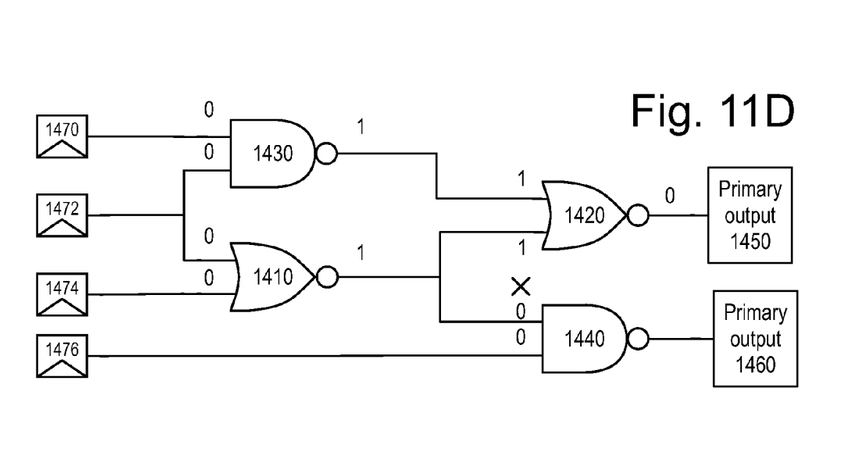

A third stage shown in FIG. 11D resolves the conflict shown in FIG. 11C by selecting (step 220) the NOR 1410 to be in a state that agrees with the settings as determined in an earlier step and may also have a low amount of leakage current. In this example, NOR 1410 is configured so that both of the inputs are '0' and its output is '1'. Referring back to Table 1, this configuration has more leakage current than the most optimal state, but still has less than other possible configurations. The configuration latch 1474 is configured to be a '1'.

Continuing the third stage, two recursive layers of selecting (step 214) have returned to the main loop in FIG. 9, wherein selecting (step 212) the next primary circuit output 1460 is examined to determine the curr_gate as the NAND gate 1440 driving the primary circuit output 1460. Selecting (step 214) an unused leakage configuration is now entered. Referring to Table 1, selecting (step 220) the lowest leakage current for the NAND gate 1440 has both related inputs '0' and the related output '1'. However, this configuration would conflict, with the state of the nodes that have been previously configured (shown again by X's in FIG. 11D).

Figure 11E:
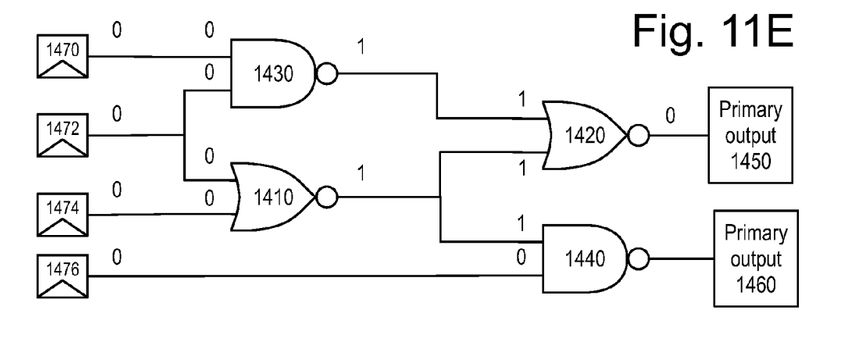

In the fourth stage shown in FIG. 11E, selecting (step 220) the configuration of the NAND gate 1440 may be determined to conform with the settings of the nodes that have previously been determined. With this, the recursively called process of FIGS. 9 and 10 exits through all the levels of recursion just discussed.

With the outputs of the configuration latches 32, 64 and/or low power states 66 determined, the states of the circuit elements may be determined and the resulting overall leakage current 52 and/or 134 may be estimated. In some embodiments, the method may be re-run, but starting from different primary circuit outputs 112. In some cases, this may result in different estimated leakage currents 194. Thus, multiple runs may provide different configurations of the leakage control table 90 and different related leakage current estimates 194 that may be selected. This approach may provide one or more low power configurations with fewer iterations than a brute force method that tries every possible configuration of every circuit element. It may be possible that the low power configurations determined with the disclosed method may not be lowest technically possible, since every configuration may not be exhaustively examined. But the disclosed method may examine fewer configurations overall and thus it may run to completion quicker than other methods.

The preceding embodiments provide examples and are not to meant constrain the scope of the following claims.

What is claimed is:

1. An integrated circuit, including:
   a configuration processor comprising a leakage control table, wherein the leakage control table is configured to include low power configuration data for configuring one or more logic gates into a reduced leakage current configuration;
   a low power configuration latch coupled with the configuration processor via an initialization bus, the low power configuration latch configured to receive the low power configuration data and provide a first low power mode state signal in accordance with the low power configuration data; and
   wherein, in response to a low power mode signal, the configuration processor is configured to retrieve the low power configuration data from the leakage control table and set the low power configuration latch in accordance with the low power configuration data for configuring the one or more logic gates into the reduced leakage current configuration.

2. The integrated circuit of claim 1, further including
   at least one Random Access Memory (RAM) generating a RAM output; and
   a selector configured to receive the RAM output and the first low power mode state signal from the low power configuration latch and further configured, in response to the low power mode signal, to select the first low power mode state signal to configure the one or more logic gates to the reduced leakage current configuration.

3. The integrated circuit of claim 1, wherein the integrated circuit is configured to be powered by at least one battery.

4. The integrated circuit of claim 1, further including a circuit block including at least part of the initialization bus and the low power configuration latch.

5. The integrated circuit of claim 4, further including analog circuitry.

6. The integrated circuit of claim 1, further including a Finite State Machine configured to operate in the reduced leakage current configuration by the low power configuration latch.

7. The integrated circuit of claim 1, wherein the leakage control table is stored in a memory coupled to the configuration processor.

8. A method comprising:
   creating a list of primary outputs included in an integrated circuit;
   selecting a primary output from the list of primary outputs;
   determining a current logic gate associated with the selected primary output, wherein an output of the current logic gate is the selected primary output;
   selecting a reduced leakage current configuration for the current logic gate; and
   determining low power state signals to be used as input signals for the current logic gate to configure the current logic gate into the selected reduced leakage current configuration, wherein at least one input signal of the low power state signals for the current logic gate is based, at least in part, on recursively determining a second reduced leakage current configuration for a second logic gate having an output coupled to at least one input of the current logic gate.

9. The method of claim 8, wherein the list of primary outputs is included in a net list.

10. The method of claim 9, wherein a low power configuration latch is added to the net list to provide the low power state signal to the current logic gate.

11. The method of claim 8, wherein the determined low power state signals are stored in a leakage control table.

12. A non-transitory machine-readable storage media having instructions stored therein, which when executed by one or more processors causes the one or more processors to perform operations that comprise:
   creating a list of primary outputs included in a net list describing an integrated circuit;
   selecting a first primary output from the list of primary outputs;
   determining a current logic gate associated with the selected first primary output;
   selecting a reduced leakage current configuration for the current logic gate; and
   determining low power state signals to be used as input signals for the current logic gate to configure the current logic gate into the selected reduced leakage current configuration, wherein at least one input signal of the low power state signal for the current logic gate is based, at least in part, on recursively determining a second reduced leakage current configuration for a second logic gate having an output coupled to at least one input of the current logic gate.

13. The non-transitory machine-readable storage media of claim 12, wherein the selecting the reduced leakage current configuration comprises:
   describing leakage current for possible configurations of the current logic gate, and
   selecting one of the possible configurations, wherein the selected reduced leakage current configuration has less leakage current than at least one other possible configuration.

14. The non-transitory machine-readable storage media of claim 12, further comprising:
   storing the low power state signals in a leakage control table.

15. The non-transitory machine-readable storage media of claim 12, further comprising:
   selecting a second primary output, different from the first primary output from the list of primary outputs;
   determining a second current logic gate associated with the selected second primary output;
   selecting a second reduced leakage current configuration for the second current logic gate; and
   determining additional low power state signals to be used as input signals for the second current logic gate to configure the second current logic gate into the selected second reduced leakage current configuration.

16. The non-transitory machine-readable storage media of claim 12 further comprising recursively determining reduced leakage current configurations for logic gates with outputs that act as inputs to another logic gate, each logic gate recursively representing the current logic gate.

17. An integrated circuit, comprising:
   a configuration processor including a leakage control table, wherein the leakage control table is configured to include low power configuration data for configuring one or more logic gates into a reduced leakage current configuration; and
   a Random Access Memory (RAM) configured by the configuration processor through an initialization bus to include a low power state signal, wherein the low power state signal is stored in a RAM location that is selected in response to a low power mode signal received through a RAM address and wherein an output of the RAM is coupled to the one or more logic gates and the low power state signal configures the one or more logic gates to the reduced leakage current configuration.

18. The integrated circuit of claim 17, wherein the integrated circuit is configured to be powered by at least one battery.

19. The integrated circuit of claim 17, further including a circuit block including at least part of the initialization bus and the RAM.

20. The integrated circuit of claim 17, further including analog circuitry.

21. The integrated circuit of claim 17, further including a Finite State Machine configured to operate in the reduced leakage current configuration by the output of the RAM.

* * * * *